(12) United States Patent
Cruzan et al.

(10) Patent No.: US 10,656,200 B2
(45) Date of Patent: May 19, 2020

(54) HIGH VOLUME SYSTEM LEVEL TESTING OF DEVICES WITH POP STRUCTURES

(71) Applicant: Advantest Test Solutions, Inc., San Jose, CA (US)

(72) Inventors: Gregory Cruzan, Anaheim, CA (US); Gilberto Oseguera, Corona, CA (US); Karthik Ranganathan, Foothill Ranch, CA (US); Edward Sprague, Lake Forest, CA (US)

(73) Assignee: ADVANTEST TEST SOLUTIONS, INC., San Jose, CA (US)

( * ) Notice: Subject to any disclaimer, the term of this patent is extended or adjusted under 35 U.S.C. 154(b) by 193 days.

(21) Appl. No.: 15/650,970

(22) Filed: Jul. 16, 2017

(65) Prior Publication Data

US 2018/0024188 A1 Jan. 25, 2018

Related U.S. Application Data

(60) Provisional application No. 62/366,601, filed on Jul. 25, 2016.

(51) Int. Cl.
*G01R 31/28* (2006.01)
*G01R 1/04* (2006.01)

(52) U.S. Cl.
CPC ....... *G01R 31/2896* (2013.01); *G01R 1/0483* (2013.01); *G01R 31/2853* (2013.01); *G01R 31/2856* (2013.01); *G01R 31/2863* (2013.01); *G01R 31/2886* (2013.01); *G01R 31/2889* (2013.01); *G01R 31/2893* (2013.01)

(58) Field of Classification Search
CPC ............ G01R 31/2896; G01R 31/2893; G01R 31/2889; G01R 31/2886; G01R 31/2863; G01R 31/2856; G01R 31/2853; G01R 1/0483
USPC ......... 324/750.15–750.19, 500, 600, 756.02, 324/76.11, 76.61, 754.01, 754.03–754.26, 324/755.01, 756.03
See application file for complete search history.

(56) References Cited

U.S. PATENT DOCUMENTS

| | | | |
|---|---|---|---|
| 6,442,818 B1 * | 9/2002 | Kay ........................ | B25B 11/02 269/903 |
| 2013/0099812 A1 * | 4/2013 | Wang ................. | G01R 31/2889 324/755.01 |
| 2014/0111235 A1 * | 4/2014 | Kikuchi ................... | G01R 1/02 324/750.23 |

* cited by examiner

*Primary Examiner* — Melissa J Koval
*Assistant Examiner* — Trung Nguyen

(57) ABSTRACT

A high volume system level testing of devices with POP structures such as POP memories includes a POP array that includes floating nests that can adjust in the XY direction in order to align individually with respective pads found on the DUTs. The floating nests also include a mechanically fixed PCB that is fixed to the nest and can either mate to a memory contactor array that can accept an unattached POP device such as a memory or can include an attached memory in order to accommodate different POP requirements. In a method, the POP array includes a number of floating nests with memory loaded are aligned and presented to their respective DUTs just prior to testing the combined DUT and POP memory assemblies.

13 Claims, 4 Drawing Sheets

HIGH VOLUME SYSTEM LEVEL TESTING OF DEVICES WITH POP STRUCTURES

CROSS REFERENCE TO RELATED APPLICATIONS

This application claims the benefit of U.S. Provisional Patent Application No. 62/366,601, filed Jul. 25, 2016, which is incorporated herein by reference in its entirety.

FIELD OF THE INVENTION

This invention relates in general to test systems and more specifically to a method and apparatus for high volume testing of devices with package-on-package structures such as POP memory.

BACKGROUND

Test systems are used to test products that have been manufactured in order to determine if the product is working to the product's design specifications. Products that are tested with such test systems include electronic devices, such as logic devices (also referred to as chips) with package-on-package (POP) structures. Such POP structures typically comprise an electronic device like a logic device that has surface mount packaging like a Ball Grid Array (BGA). The BGA are solder balls on a surface or surfaces of the logic device. These BGA balls allow mounting of a second device such as a memory device directly on top of the logic device instead of having to rely on a circuit board and traces to interconnect the logic device to the memory, thus saving precious circuit board space and thereby lower the cost. Some types of logic devices that are tested can include processors, mobile station modems as used in mobile phones, radio frequency circuits, digital and analog devices and any other type of electronic chip that can take advantage of vertical stacking provided by POP structures.

Current automated system level test systems that perform system level test of logic devices that include a temporarily interconnected POP device such as a POP memory typically involve two handler arms which are required for the testing. One handler arm inserts the logic device onto a testing socket and the second handler arm places the memory directly on top of the device, making sure the memory is properly aligned and making proper electrical interconnection to the logic device. An alternative to the two handler arm technique is to use a single handler arm containing the memory and vacuum provided on the sides of the memory to pick and place the base logic device and place it into a testing socket. Both of the above test systems describe test system architectures that do not scale very well and cannot test a high volume of devices in a timely or cost effective fashion. This causes the test times to be too long, thus increasing the cost of the testing of each device.

BRIEF DESCRIPTION OF THE DRAWINGS

The features of the present invention, which are believed to be novel, are set forth with particularity in the appended claims. The invention may best be understood by reference to the following description, taken in conjunction with the accompanying drawings, in the several figures of which like reference numerals identify like elements, and in which:

DETAILED DESCRIPTION

Figure 1:
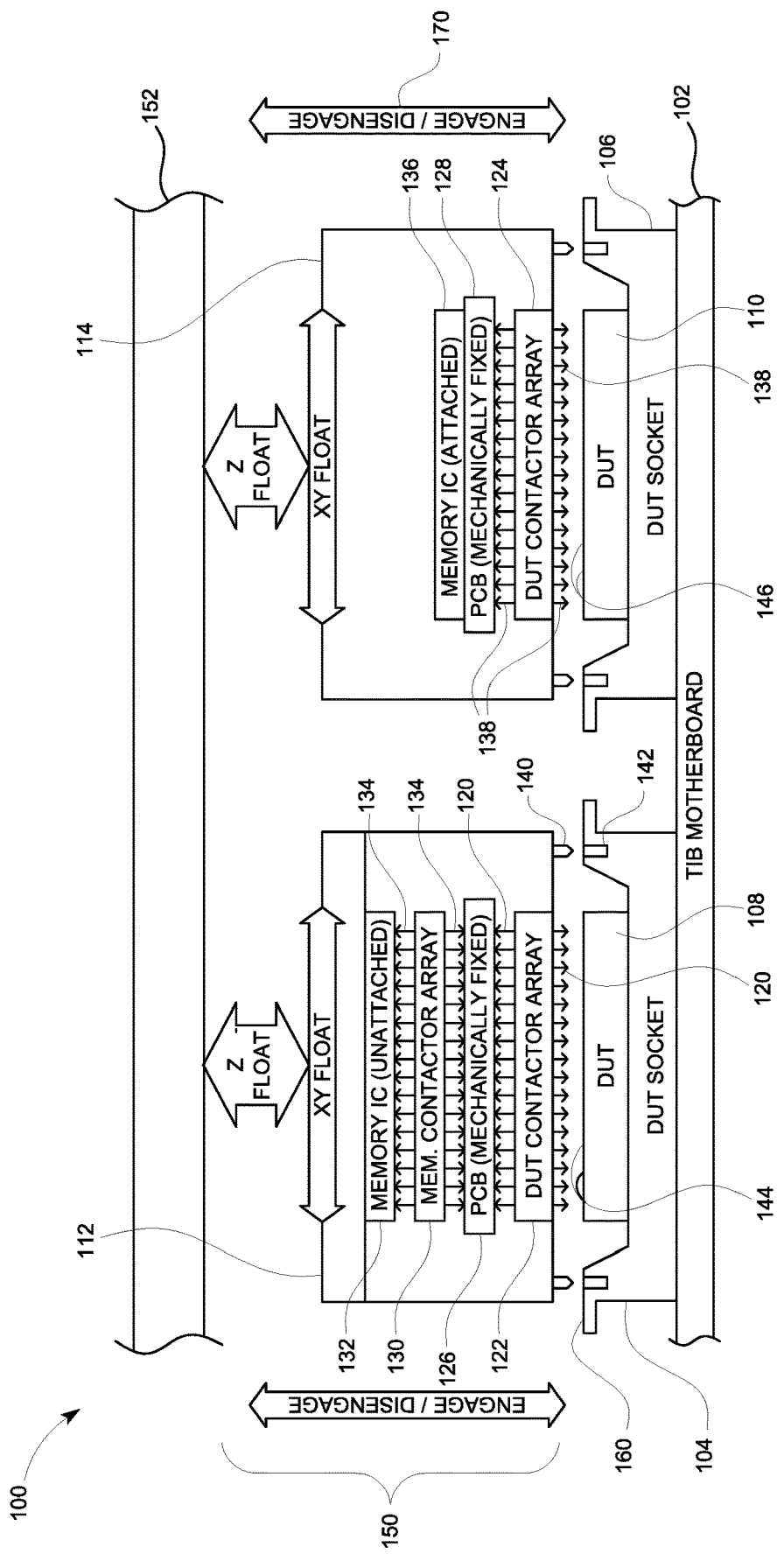
FIG. 1 shows a partial side view of a POP array being testing using a test system in accordance with an embodiment of the invention.

While the specification concludes with claims defining the features of the invention that are regarded as novel, it is believed that the invention will be better understood from a consideration of the following description in conjunction with the drawing figures.

Referring to FIG. 1, there is shown a drawing of a partial side view of a POP array test system 100 in accordance with an embodiment of the invention showing two POP array locations. The Test system 100 includes a test interface board (TIB) 102, the TIB 102 is a printed circuit board with traces and one or more connectors (not shown) to electrically interconnect the TIB 102 to the test system that will test the devices that will be undergoing testing and that are mounted to sockets found on the TIB 102. Located on the top surface of soldered to or otherwise attached to the TIB 102 are device-under-test (DUT) sockets 104 and 106. The DUT sockets 104 and 106 can be any well-known socket type used for receiving an electronic device such as a logic device (e.g., processor, etc.) which is the device that will be undergoing testing, also referred to as device-under-test (DUT) 108 and 110. Although two sockets 104 and 106 are shown, in one embodiment of the invention, eighteen DUT sockets are located on the TIB 102. The number of socket locations in a POP array can change depending on the extent of parallelism that is required for the test system.

Shown above each of the DUTs 108 and 110 is a TIB array also called a POP array 150. As shown, the POP array 150 includes floating nests 112 and 114. In one embodiment of the invention, eighteen floating nests are located one each above each DUT found in the TIB 102. The floating nest 112 on the left side is shown to include a DUT contactor array 122 which is comprised of a number of interconnection pins such as electrically conductive pogo pins 120 that are held in a vertical position by a surround fab part. The pogo pins 120 extend beyond the height of the fab part on both the first or top major surface and second or bottom major surface allowing the pogo pins to be compressed by objects above and below the pogo pins 120. The fab part keeps the pogo pins 120 from falling out when they are not compressed since the fab part keeps the pogo pins 120 secure. The fab part of DUT contactor array 122 can be made from a nonconductive (insulator) material such as plastic or any other commonly used material for such applications. The fab part can be manufactured using one of a number of manufacturing techniques such as by injection molding the part.

POP array 150 needs to have mechanical float in both the X and Y directions, and this float must be independent for each DUT site (location where DUTs 108 and 110 are located) so each of the floating nests 112 and 114 needs to move independently from each other in the X and Y axis directions in order to allow the floating nests 112 and 114 to properly align to their respective DUTs 108 and 110. This allows the DUT contactor array pogo pins 120 to make contact with the respective BGA pads 144 found on the top surface of the DUT 108, or in the case of nest 114 the pogo pins 138 found on DUT contactor array 124 to make contact with the BGA pads 146 found on the top surface of DUT 110.

On top of DUT contactor array 122 is a mechanically fixed substrate such as a printed circuit board (PCB) 126 which is used to receive a memory contactor array 130 which is similarly constructed to DUT contractor array 122 with a plurality of electrically conductive pogo pins 134. Pogo pins 134 extend from both the first or top major surface and the second or bottom major surface, making contact between electrical connection pads located on a memory integrated circuit (IC) 132 and pads located on PCB 126 via pogo pins 134. The PCB 126 is fixed to the floating nest. The PCB 126 can be fixed using one of a number of techniques such as by press fitting the PCB, or mechanically fastening the PCB as some examples.

As shown in FIG. 1, the buildup of the two POP heads 112 and 114 is different. POP head 114 on the right side of FIG. 1 shows a memory IC 136 that is directly soldered to a PCB 128. The location of the PCB is fixed within the POP head (hard-mounted to the head). Some designs can use this solution, but other designs want to avoid soldering the memory to a PCB. In this case, the solution shown on the left side of FIG. 1 with nest 112 is used. Here again, the PCB 126 is hard-mounted to the nest 112, as shown in the case of the POP head 112 on the left side, where memory 132 is temporarily interconnected to PCB 126 using memory contractor array 130. There is a lid 152 above the memory IC 132 that causes the memory contactor array pogo pins 134 to compress as well as the pogo pins 120 of the DUT contractor array 122. In similar fashion lid 152 causes the PCB 128 to compress the pogo pins 138 found in contactor array 124 thereby electrically interconnecting the memory IC pads to the pads 146 found on the top surface of DUT 110. The lid 152 when activated causes nests 112 and 114 to engage or disengage 170 from DUTs 108 and 110.

Alignment features such as pins 140 and locator apertures 138 for accepting the pins 140 are shown near the outside of the socket 104. The same alignment feature is found for nest 114 and socket 106. Other alignment techniques known in the art can be used to properly align the nests 112 and 114 to their respective sockets 104 and 106, thus allowing the pads on the respective POP memories 132 and 136 to be properly aligned to the pads 144 and 146.

In accordance with an embodiment of the invention, the DUTs 108, 110 are inserted into their respective sockets 104, 106 via a handler arm and then once all of the DUTs (108, 110, etc.) are properly inserted into their respective sockets, an entire above-TIB POP array 150 containing memory devices contacts the respective logic devices from the top, actuated by pneumatic pressure. A high resolution camera can be mounted in the handler. It can be used to determine the XY offset of the contact pads 144 and 146 on top of DUTs 108 and 110 within a burn-in-board (BIB), just before the BIB is moved to a system level test (SLT). As shown in FIG. 1, DUT sockets 104 and 106 include wing structures (or wings) on either side 160 that can receive associated "grabbers" (not shown) that grab the wing structures and assist with the localization of pressure during testing helping to avoid damage to the DUT sockets 104 and 106.

Figure 2:
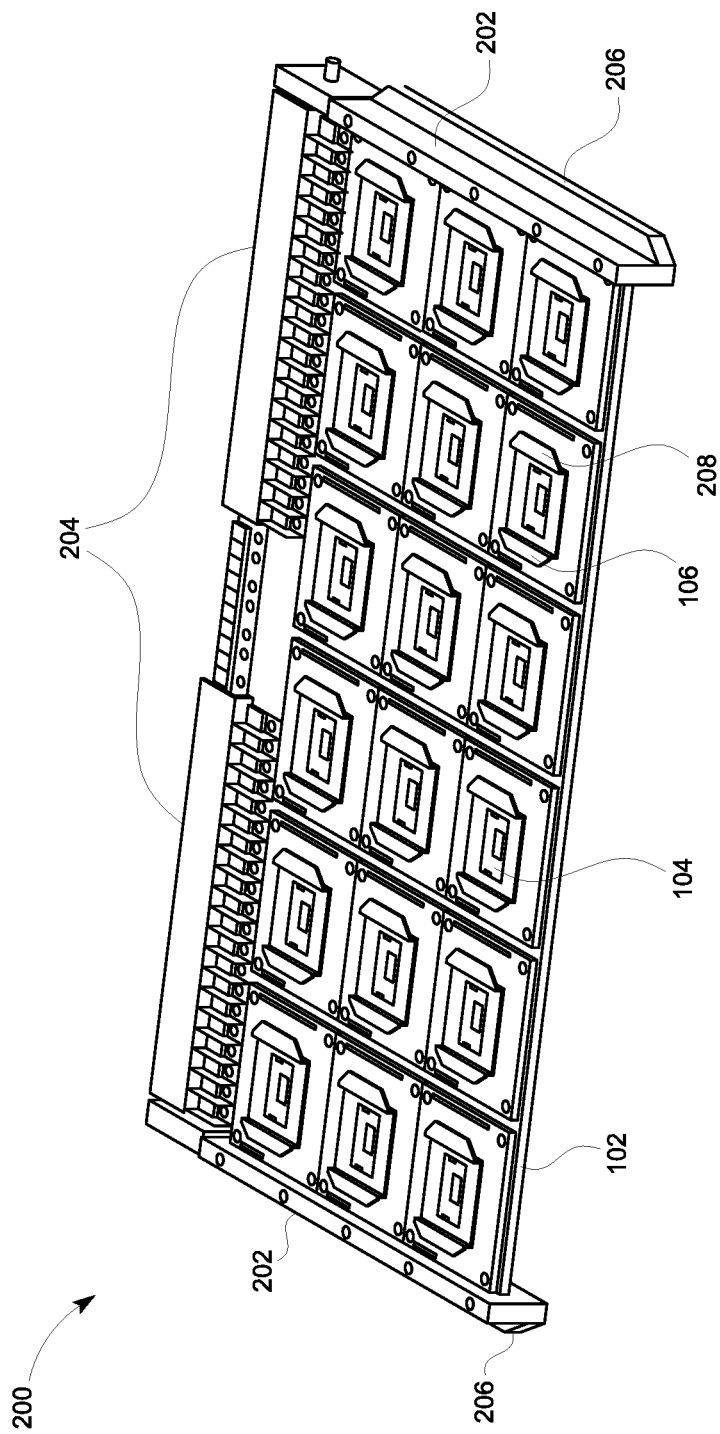
FIG. 2 shows a test interface board having a number of DUT sockets in accordance with an embodiment of the invention.

Referring now to FIG. 2, there is shown a test-interface-board carrier 200 that includes a plurality of electrical connectors 204 that electrically interconnect the DUT that are inserted into the DUT sockets like sockets 104 and 106. The electrical interconnections provide power, control signals, etc. from the DUTs to and/or from the test system (not shown) which is used to perform the system test on the DUTs and POP devices that are placed on each of the DUTs. In the particular design shown in FIG. 2 there are 18 DUT sockets. The number of DUT sockets 104 and 106 located on TIB 102 can vary depending on the necessary design requirements. The sockets 104, 106 and the remaining sockets are soldered onto the TIB 102, as well as connectors 204. The DUT sockets in one embodiment include wing structures 208 on two of its sides. These wing structures (or wings) assist with localization of pressure during testing. In the absence of these structures the TIB 102 and/or the POP memory arrays could be damaged or break.

A pair of side supports 202 have inside channels for receiving the side edges of TIB 102 and outer surfaces with rails 206 that allows the TIB carrier 200 to slide into a test system (not shown) slot so the electrical connectors 204 can interconnect with mating connectors found in the test system. Once inserted into the test system, the TIB carrier 202 can receive all necessary power and data inputs/outputs to/from the DUTs to the test system that is controlling the testing of the DUTs. In some test systems, the TIB carriers are automatically injected causing the electrical connectors 204 to electrically connect with connectors found in the test system prior to the testing of the DUTs commencing. Once the testing is completed, the test system can automatically eject the TIB carrier.

Figure 3:
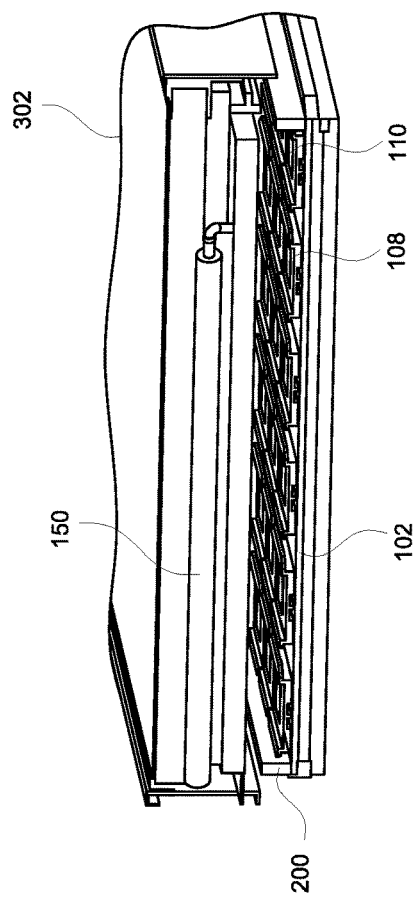
FIG. 3 shows a partial slot in a test system for receiving a DUT carrier in accordance with an embodiment of the invention.

In FIG. 3 there is shown one compartment 302 of a partial test system figure which can receive the TIB carrier 200 with the TIB motherboard 102 and sockets 108 and 110 shown through the opening. The POP array 150 previously discussed in FIG. 1 is shown above the TIB 102. Above each of the DUT sockets which are mounted on the TIB 102 are respective POP array locations, so in the example of having eighteen DUT sockets, there would be eighteen POP array locations each directly above each socket ready to align and interconnect temporarily a POP memory or other POP circuity to that DUT that is going to be tested. Each of the eighteen POP array locations can operate independently and align to its respective DUT as needed as previously discussed.

Figure 4:
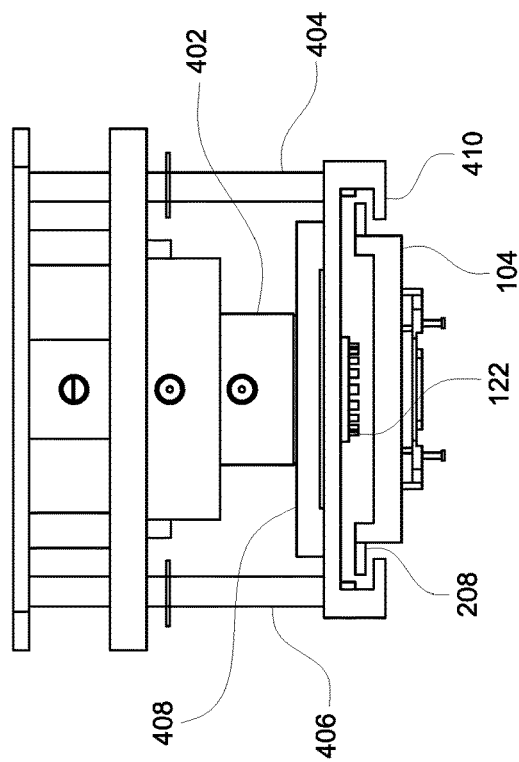
FIG. 4 shows a compound nest apparatus in accordance with an embodiment of the invention.

Referring now to FIG. 4 there is show a compound nest apparatus found in each of the POP array locations above the DUT sockets. The compound nest apparatus which is one location in the POP array 150 that is used for example to align and present a POP device such as the POP memory 132 to an individual DUT mounted on DUT socket 104. Each of the DUT sockets has an associated compound nest apparatus that is used to present the POP device to its respective DUT that will undergo testing. Each location is actuated by pneumatic pressure which causes a cylinder 402 to present the pogo pins 120 found on the DUT contactor array 122 to the BGA pads found on the DUT. A pair of guide rods 404 and 406 help maintain the cylinder 402 in alignment as it is driven downwards towards the DUT once the pogo pins are aligned to the BGA pads found on the top surface of the DUT. A platen 408 is used to keep the floating nest 112 in place while being presented to the DUT. Once the compound nest apparatus 400 is pressed downward using pneumatic pressure, the pogo pins 120 make contact with the pads on the DUT and the POP memory 132 (not shown) is then properly connected to the DUT and testing can commence. The compound nest 400 includes grabber portions 410 that engage with the wings 208 found on the sides of DUT socket 104. As previously mentioned the wings 208 and grabber portions 410 assist with the localization of pressure presented to the socket 104 during testing, helping to avoid damage to the DUT socket 104.

Figure 5:
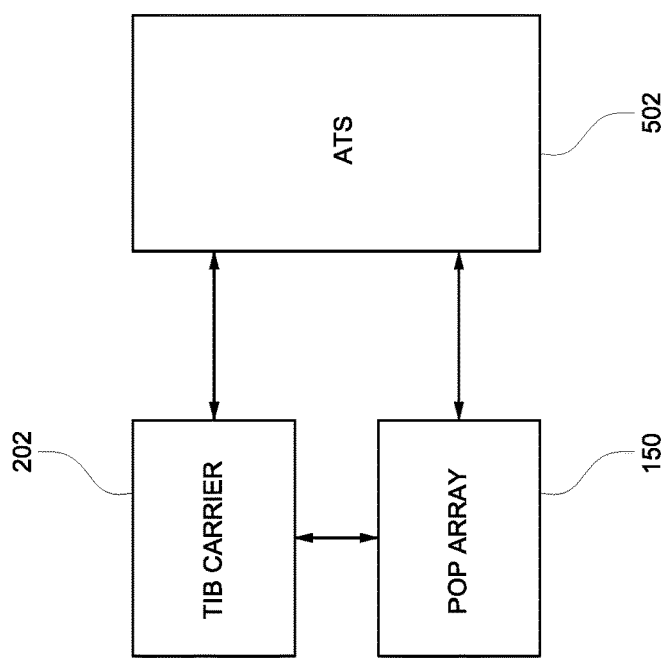
FIG. 5 shows a block diagram of a test system in accordance with an embodiment of the invention.

In FIG. 5 there is shown a simplified block diagram of an automatic test system (ATS) that can perform the testing of high volumes of devices having POP devices such as POP memories. The ATS 502 can comprise an ATS such as an Astronics Test Systems, Inc. model ATS 5033 which is modified to include the POP array capabilities described herein which includes the POP array 150 associated with each TIB carrier 202 that is inserted into slots of the ATS 502. The number of TIB carriers 202 that the ATS 502 can support can depend on the level of parallelism that is needed. Other ATS can take advantage of the POP array above TIB described herein.

Figure 6:
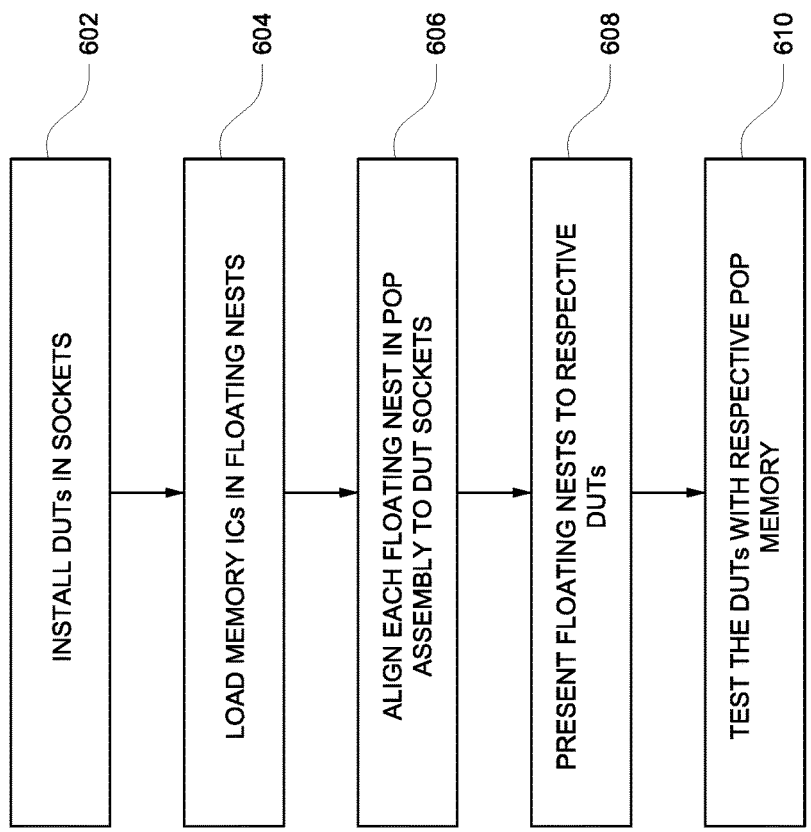
FIG. 6 shows a flowchart highlighting the steps used in testing DUTs with associated POP devices in accordance with an embodiment of the invention.

Referring now to FIG. 6, there is shown a flowchart highlighting some of the steps and/or actions taken in one embodiment of the invention. The order of the steps and/or actions can be modified without departing from the scope of the claims. The method begins with the DUTs 108 and 110 being loaded onto their DUT sockets 108 and 110 in step 602. Memory ICs either unattached 132 or attached 136 as described in associated with FIG. 1 are loaded into the floating nests 112 and 114 found in the POP array 150 in step 604. Each of the floating nests 112 and 114 are aligned to their respective DUT sockets 108 and 110 in the X and Y axis in step 606 so that the DUT contactor array interconnection pins 120 and 136 are aligned with the pads 144 and 146 on the DUTs 108 and 110. Once aligned, in step 608 the POP assembly 150 with the floating nests 112 and 114 are presented to the DUTs by moving the floating nests in the Z axis using pneumatic pressure so that the DUT contactor array interconnection pins 120 and 138 make contact with the respective pads on the DUTs 144 and 146. In step 610, the DUT's 108 and 110 are tested with their respective memory ICs 132 and 136. Although only two floating nests where described above, in another embodiment the POP array 150 supports eighteen floating nests. Although it should be noted that the number of floating nests in a POP array can vary in number based on the desired design requirements. The POP array 150 allows for numerous DUTs to be presented with their respective POP memory or other POP device in a much faster fashion, and can support both attached or unattached memory ICs, thereby saving testing time and costs.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A test apparatus comprising:
   first and second floating nests, wherein each floating nest is operable to move in the X and Y axes;
   a first device-under-test (DUT) contactor array comprising a plurality of interconnection pins extending from a top and bottom surface of the DUT contactor array, the first DUT contactor array disposed in the first floating nest; and
   a substrate fixed to the first floating nest and comprising pads on a first surface for receiving the plurality of interconnection pins from the first DUT contactor array, wherein the substrate comprises a printed circuit board (PCB) having a second surface, the second surface comprising pads;
   a memory contactor array comprising a plurality of interconnection pins extending from first and second surfaces of the memory contactor array, wherein the plurality of interconnection pins extending from the second surface of the memory contactor array couple to the pads on the second surface of the PCB; and
   a memory coupled to the plurality of interconnection pins extending from the first surface of the memory contactor array.

2. The test apparatus of claim 1, wherein the plurality of interconnection pins extending from the DUT contactor array comprise pogo pins and the pogo pins are compressed when pneumatic pressure is applied to the first floating nest.

3. The test apparatus of claim 1, wherein the first and second floating nests are operable-to move in the Z-axis.

4. The test apparatus of claim 1, further comprising:
   alignment features disposed on the first and second floating nests for aligning the first and second floating nests to respective device under test (DUT) sockets.

5. The test apparatus of claim 4, wherein each of the respective DUT sockets comprise wing structures along at least two sides of the DUT socket.

6. The test apparatus of claim 5, further comprising:
   a compound nest comprising first and second grabber structures operable to grab the wing structures disposed on the DUT socket.

7. A method for testing devices with POP structures attached, comprising:
   installing devices into a plurality of sockets disposed on a test interface board (TIB);
   loading package-on-package (POP) devices onto floating nests located in a POP array, the POP array located above the (TIB), wherein a single floating nest is associated with each of the plurality of sockets;
   aligning each of the floating nests to the respective devices disposed in the plurality of sockets; and
   presenting the floating nests to the respective devices, wherein each of the POP devices is electrically coupled with the respective device, wherein the presenting is performed by using pneumatic pressure, wherein each of the floating nests is moved towards the respective device.

8. The method of claim 7, wherein the POP devices comprise memory ICs.

9. The method of claim 7, wherein the POP devices comprise logic devices comprising pads on a first major surface.

10. The method of claim 7, further comprising:
    testing the devices with the respective POP devices interconnected to the devices.

11. An above test interface board package-on-package (POP) array, comprising:
    a floating nest operable to move in the X, Y and Z axes;
    a device-under-test (DUT) contactor array comprising a plurality of interconnection pins extending from a top and bottom surface of the DUT contactor array, the DUT contactor array disposed inside of the first floating nest; and
    a circuit board fixed to the floating nest and comprising conductive pads on first and second surfaces, the conductive pads on the first surface operable to receive the plurality of interconnection pins from the top surface of the DUT contactor array; and
    a memory integrated circuit coupled to the conductive pads on the second surface of the circuit board.

12. The above test interface board package-on-package (POP) claim 11, wherein the memory integrated circuit is fixed to the second surface of the circuit board.

13. The above test interface board package-on-package (POP) claim 11, further comprising:
- a memory contactor array comprising a plurality of interconnection pins extending from first and second surfaces of the memory contactor array;
- a memory coupled to the interconnection pins extending from the first surface of the memory contactor array; and
- the plurality of interconnection pins extending from the second surface of the memory contactor array coupled to respective conductive pads on the second surface of the circuit board.

* * * * *